United States Patent
Kang et al.

(10) Patent No.: US 11,163,334 B2
(45) Date of Patent: Nov. 2, 2021

(54) DISPLAY DEVICE HAVING PROTECTIVE COVER

(71) Applicant: Samsung Display Co., Ltd., Yongin-Si (KR)

(72) Inventors: Gowoon Kang, Cheonan-si (KR); Kyuhan Bae, Asan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 22 days.

(21) Appl. No.: 16/417,741

(22) Filed: May 21, 2019

(65) Prior Publication Data
US 2020/0057472 A1 Feb. 20, 2020

(30) Foreign Application Priority Data
Aug. 20, 2018 (KR) .................. 10-2018-0096945

(51) Int. Cl.
| | |
|---|---|
| *G06F 1/16* | (2006.01) |
| *H04M 1/18* | (2006.01) |
| *H04M 1/02* | (2006.01) |
| *H05K 3/38* | (2006.01) |

(52) U.S. Cl.
CPC .......... *G06F 1/1637* (2013.01); *G06F 1/1601* (2013.01); *G06F 1/1626* (2013.01); *G06F 1/1643* (2013.01); *G06F 1/1652* (2013.01); *H04M 1/0268* (2013.01); *H04M 1/185* (2013.01); *H05K 3/388* (2013.01); *C09J 2301/124* (2020.08); *H04M 1/0266* (2013.01);
(Continued)

(58) Field of Classification Search
CPC .... G06F 1/1641; G06F 1/1637; G06F 1/1601; G06F 1/1626; G06F 1/1643; G06F 1/1652; H04M 1/0268; H05K 3/388
See application file for complete search history.

(56) References Cited

U.S. PATENT DOCUMENTS

| | | | |
|---|---|---|---|
| 9,736,931 B2 * | 8/2017 | Eom | G06F 1/1637 |
| 9,818,974 B2 * | 11/2017 | Kwon | G02F 1/133305 |
| 9,933,870 B2 * | 4/2018 | You | G06F 3/041 |

(Continued)

FOREIGN PATENT DOCUMENTS

| | | |
|---|---|---|
| KR | 1020140128721 A | 11/2014 |
| KR | 1020180021291 A | 3/2018 |
| KR | 1020180029190 A | 3/2018 |

*Primary Examiner* — Jinhee J Lee
*Assistant Examiner* — Douglas R Burtner
(74) *Attorney, Agent, or Firm* — Cantor Colburn LLP

(57) ABSTRACT

A display device includes a display module including a bending area at which the display module is bent, and a non-bending area which extends from the bending area; a driving control module connected to the bending area of the display module; and a protective cover removably attachable to the display module, the protective cover including a cover portion and a support protrusion which protrudes from the cover portion. The display module bent at the bending area thereof disposes the driving control module facing a rear surface of the display module, and the protective cover attached to the display module bent at the bending area thereof disposes each of: the cover portion of the protective cover corresponding to the bending area of the display module and to the driving control module facing the rear surface of the display module, and the support protrusion corresponding to the driving control module.

20 Claims, 13 Drawing Sheets

(52) U.S. Cl.
CPC ... *H04M 1/0277* (2013.01); *H05K 2201/0338* (2013.01)

(56) References Cited

U.S. PATENT DOCUMENTS

| | | | | |
|---|---|---|---|---|
| 10,056,204 | B2* | 8/2018 | Lee | H04M 1/236 |
| 10,248,233 | B2* | 4/2019 | Cheng | G06F 1/1626 |
| 10,254,799 | B2* | 4/2019 | Nishikawa | H01L 51/5253 |
| 10,289,155 | B2* | 5/2019 | Cheng | G06F 1/1603 |
| 10,306,766 | B2* | 5/2019 | Shi | H01L 51/0097 |
| 10,490,770 | B2* | 11/2019 | Kim | G06F 1/1637 |
| 10,521,040 | B2* | 12/2019 | Lin | G06F 3/0412 |
| 10,775,849 | B2* | 9/2020 | Fujimoto | G06F 1/1641 |
| 10,869,388 | B2* | 12/2020 | Park | H01L 51/56 |
| 2014/0320762 | A1* | 10/2014 | Jeong | G06F 1/1626 |
| | | | | 349/12 |
| 2015/0316810 | A1* | 11/2015 | Shibahara | G02F 1/133382 |
| | | | | 349/150 |
| 2016/0026381 | A1* | 1/2016 | Kim | G06F 3/04886 |
| | | | | 715/761 |
| 2016/0195896 | A1* | 7/2016 | Shin | H04M 1/0202 |
| | | | | 455/566 |
| 2016/0234362 | A1* | 8/2016 | Moon | H04M 1/185 |
| 2016/0270269 | A1* | 9/2016 | Bae | H01L 51/529 |
| 2016/0334560 | A1* | 11/2016 | You | G02B 6/0091 |
| 2017/0060188 | A1* | 3/2017 | Han | G06F 1/1681 |
| 2017/0092177 | A1* | 3/2017 | Kobayashi | G06F 1/1637 |
| 2017/0139442 | A1* | 5/2017 | Yoshizumi | H04M 1/0247 |
| 2018/0017999 | A1* | 1/2018 | Kim | H05K 1/0298 |
| 2018/0053817 | A1 | 2/2018 | Kishimoto et al. | |
| 2018/0076412 | A1* | 3/2018 | Kim | G06F 1/1637 |
| 2018/0294427 | A1* | 10/2018 | Lee | H05K 1/147 |
| 2019/0012007 | A1* | 1/2019 | Kim | G06F 1/1652 |
| 2019/0037694 | A1* | 1/2019 | Koo | H05K 1/028 |
| 2019/0174658 | A1* | 6/2019 | Qi | H05K 5/0017 |
| 2019/0212781 | A1* | 7/2019 | Fujimoto | G06F 1/1641 |
| 2019/0227368 | A1* | 7/2019 | Sim | G02F 1/13306 |
| 2019/0320048 | A1* | 10/2019 | Yang | H04M 1/0247 |
| 2020/0028948 | A1* | 1/2020 | Shin | H04M 1/0268 |

\* cited by examiner

DISPLAY DEVICE HAVING PROTECTIVE COVER

This application claims priority to Korean Patent Application No. 10-2018-0096945, filed on Aug. 20, 2018, and all the benefits accruing therefrom under 35 U.S.C. § 119, the entire contents of which are hereby incorporated by reference.

BACKGROUND

(1) Field

The present disclosure herein relates to a display device and a method for fabricating an electronic device using the same. More particularly, the present disclosure relates to a display device capable of reducing defects and a method for fabricating an electronic device using the same.

(2) Description of the Related Art

Electronic devices such as smart phones, tablets, notebook computers, and smart televisions have been developed. These electronic devices may include display devices to provide information. The electronic devices may further include various electronic modules in addition to the display devices.

The electronic device may be fabricated by assembling the display device and the electronic modules to each other. At this time, the electronic modules may be organically arranged using an outer case and a bracket of the electronic device.

SUMMARY

The present disclosure may provide a display device capable of protecting a bending area of a display module of the display device when being transferred.

The present disclosure may also provide a method for fabricating an electronic device using the display device of which defects are reduced by protecting a bending area of a display module of the display device when being transferred.

In an exemplary embodiment of the invention, a display device includes a display module including a bending area at which the display module is bent, and a non-bending area which extends from the bending area; a driving control module connected to the bending area of the display module; and a protective cover removably attachable to the display module, the protective cover including a cover portion and a support protrusion which protrudes from the cover portion. The display module bent at the bending area thereof disposes the driving control module facing a rear surface of the display module, and the protective cover attached to the display module bent at the bending area thereof disposes each of: the cover portion of the protective cover corresponding to the bending area of the display module and to the driving control module facing the rear surface of the display module, and the support protrusion corresponding to the driving control module.

In an exemplary embodiment, the support protrusion may be provided in plurality each protruding from the cover portion.

In an exemplary embodiment, the support protrusion may be between the cover portion and the driving control module facing the rear surface of the display module.

In an exemplary embodiment, the driving control module may include a circuit board attached to the bending area of the display module, and the circuit board may include a plurality of base films sequentially stacked.

In an exemplary embodiment, the support protrusion may be in contact with the circuit board.

In an exemplary embodiment, the driving control module may further include a circuit element mounted on an outer surface of the plurality of base films, and a cover film covering the circuit element.

In an exemplary embodiment, the support protrusion may be in contact with the cover film.

In an exemplary embodiment, the protective cover may further include a fixing portion with which the protective cover is fixable to the rear surface of the display module.

In an exemplary embodiment, the fixing portion may have a plate shape and may face the rear surface of the display module.

In an exemplary embodiment, the protective cover may further include a double-sided adhesive member with which the fixing portion is fixable to the rear surface of the display module.

In an exemplary embodiment, the protective cover may further include a connection portion extending from an end of the cover portion and connecting the fixing portion and the cover portion to each other.

In an exemplary embodiment, the display device may further include a window. The protective cover may further include a guide bar protruding from the cover portion, disposed at an end of the display module and facing both an edge of the window and the bending area.

In an exemplary embodiment, the display device may further include a window. The display module may include a display panel corresponding to the non-bending area and the bending area, and an input sensing unit disposed between the window and the display panel.

In an exemplary embodiment, the display module may further include a protective film which disposes the display panel between the input sensing member and the protective film.

In an exemplary embodiment, the bending area may include a curvature area adjacent to the non-bending area, and a facing area which is adjacent to the curvature area and faces the non-bending area. The protective film may be disposed to correspond to the non-bending area and the facing area but may not be disposed in the curvature area.

In an exemplary embodiment, the display module may further include a stress control film corresponding to the curvature area, the stress control film terminating at the non-bending area.

In an exemplary embodiment, the display module may further include a support panel corresponding to the non-bending area.

In an exemplary embodiment, the display panel may include a base layer disposed to correspond to the non-bending area and the bending area, a circuit layer disposed on the base layer and disposed to correspond to the non-bending area and the bending area, an element layer disposed on the circuit layer and overlapping with the non-bending area, and an encapsulation layer disposed on the element layer.

In an exemplary embodiment of the invention, a method for fabricating an electronic device includes providing a display device including a display module which displays an image and includes a bending area at which the display module is bent and a non-bending area which extends from the bending area, a driving control module connected to the bending area of the display module, and a protective cover removably attachable to the display module, the protective cover including a cover portion and a support protrusion which protrudes from the cover portion; bending the display module at the bending area thereof, the display module bent at the bending area thereof disposing the driving control module facing a rear surface of the display module; and attaching the protective cover to the display module bent at the bending area thereof and disposing the driving control module facing the rear surface of the display module, the attaching the protective cover to the display module disposes each of: the cover portion of the protective cover corresponding to the bending area of the display module and to the driving control module facing the rear surface of the display module, and the support protrusion corresponding to the driving control module; removing the protective cover from the display module; and coupling the display module from which the protective cover is removed to a component of the electronic device.

In an exemplary embodiment, the driving control module may include a circuit board attached to the bending area of the display module, and the circuit board may include a plurality of base films sequentially stacked. The attaching the protective cover may include disposing the protective cover in such a way that the support protrusion is in contact with an outermost one of the plurality of base films.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain principles of the invention. In the drawings.

DETAILED DESCRIPTION

Figure 1:
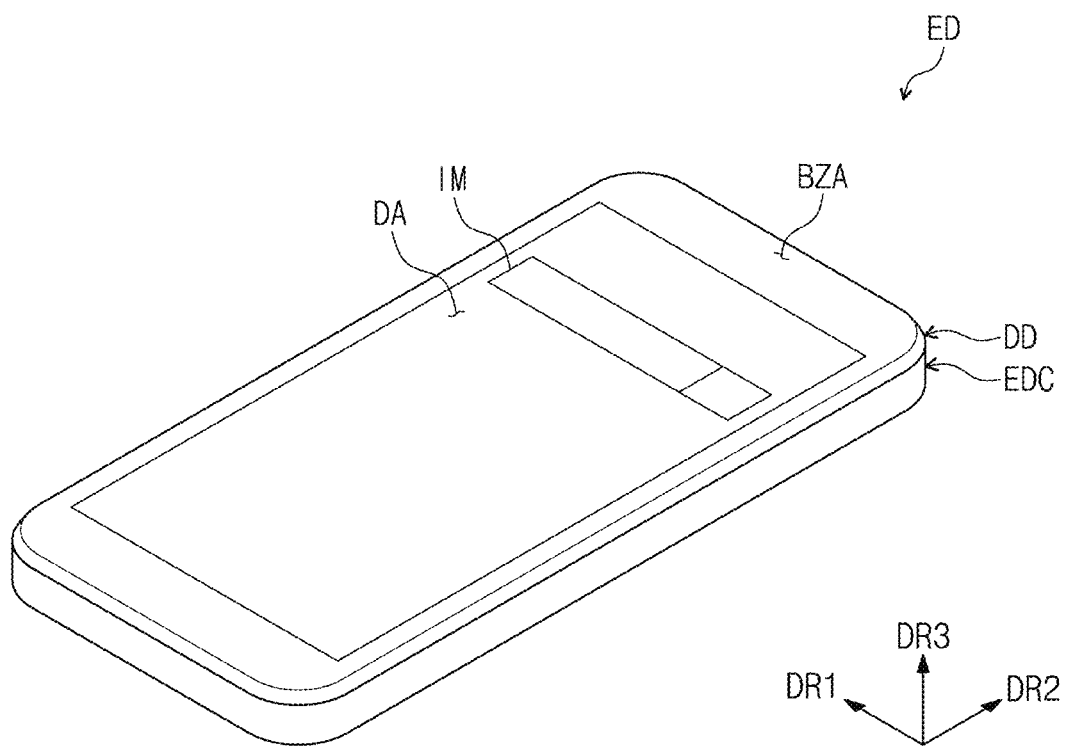
FIG. 1 is a perspective view illustrating an exemplary embodiment of an electronic device according to the invention.

The invention will be described more fully hereinafter with reference to the accompanying drawings, in which various embodiments are shown. The invention may, however, be embodied in many different forms, and should not be construed as limited to the embodiments set forth herein. Rather, these embodiments are provided so that this disclosure will be thorough and complete, and will fully convey the scopes of the invention to those skilled in the art. Like reference numerals refer to like elements throughout.

It will be understood that when an element such as a layer, region or substrate is referred to as being related to another element such as being "on" another element, it can be directly on the other element or intervening elements may be present. In contrast, the term "directly" means that there are no intervening elements.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings herein.

Exemplary embodiments are described herein with reference to cross-sectional illustrations and/or plane illustrations that are idealized exemplary illustrations. In the drawings, the thicknesses of layers and regions are exaggerated for clarity. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of exemplary embodiments.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Hereinafter, exemplary embodiments of the invention will be described in detail with reference to the accompanying drawings.

FIG. 1 is a perspective view illustrating an exemplary embodiment of an electronic device ED according to the invention.

Referring to FIG. 1, a smart phone is illustrated as an example of an electronic device ED in the exemplary embodiment. However, embodiments of the invention are not limited thereto. In certain embodiments, the electronic device ED may be a tablet, a notebook computer or a smart television.

As illustrated in FIG. 1, a display surface on which an image IM is displayed may be disposed in a plane which is parallel to a plane defined by a first directional axis DR1 and a second directional axis DR2. The display surface may include a display area DA and a bezel area BZA which is adjacent to the display area DA. In FIG. 1, an internet search box is illustrated as an example of the image IM. In an exemplary embodiment, the display area DA may have an overall quadrilateral shape (e.g., a rectangular shape). The bezel area BZA may surround the display area DA. In other words, the bezel area BZA may form a border of the display surface.

A normal direction perpendicular to the display surface (e.g., a thickness direction of the electronic device ED) may be parallel to a third directional axis DR3. A front surface (or a top surface or a first surface) and a rear surface (or a bottom surface or a second surface) of the electronic device ED and each member thereof may be defined based on a direction in which the image IM is displayed. However, directions indicated by the first to third directional axes DR1, DR2 and DR3 may be relative concepts and may be changed into other directions. Hereinafter, first to third directions are the directions indicated by the first to third directional axes DR1, DR2 and DR3, respectively, and are indicated by the same reference designators as the first to third directional axes DR1, DR2 and DR3.

The electronic device ED may include a display device DD and an outer case EDC. The display device DD will be described later in detail.

The outer case EDC may be coupled to the display device DD. The outer case EDC may provide portions of an outer surface of the electronic device ED. In the exemplary embodiment, the outer case EDC in one singular body is illustrated as an example. However, embodiments of the invention are not limited thereto. In another exemplary embodiment, the outer case EDC may include a plurality of separate bodies assembled with each other. The outer case EDC may include a plurality of frames and/or plates, which include or are formed of glass, plastic, and/or a metal.

Figure 2:
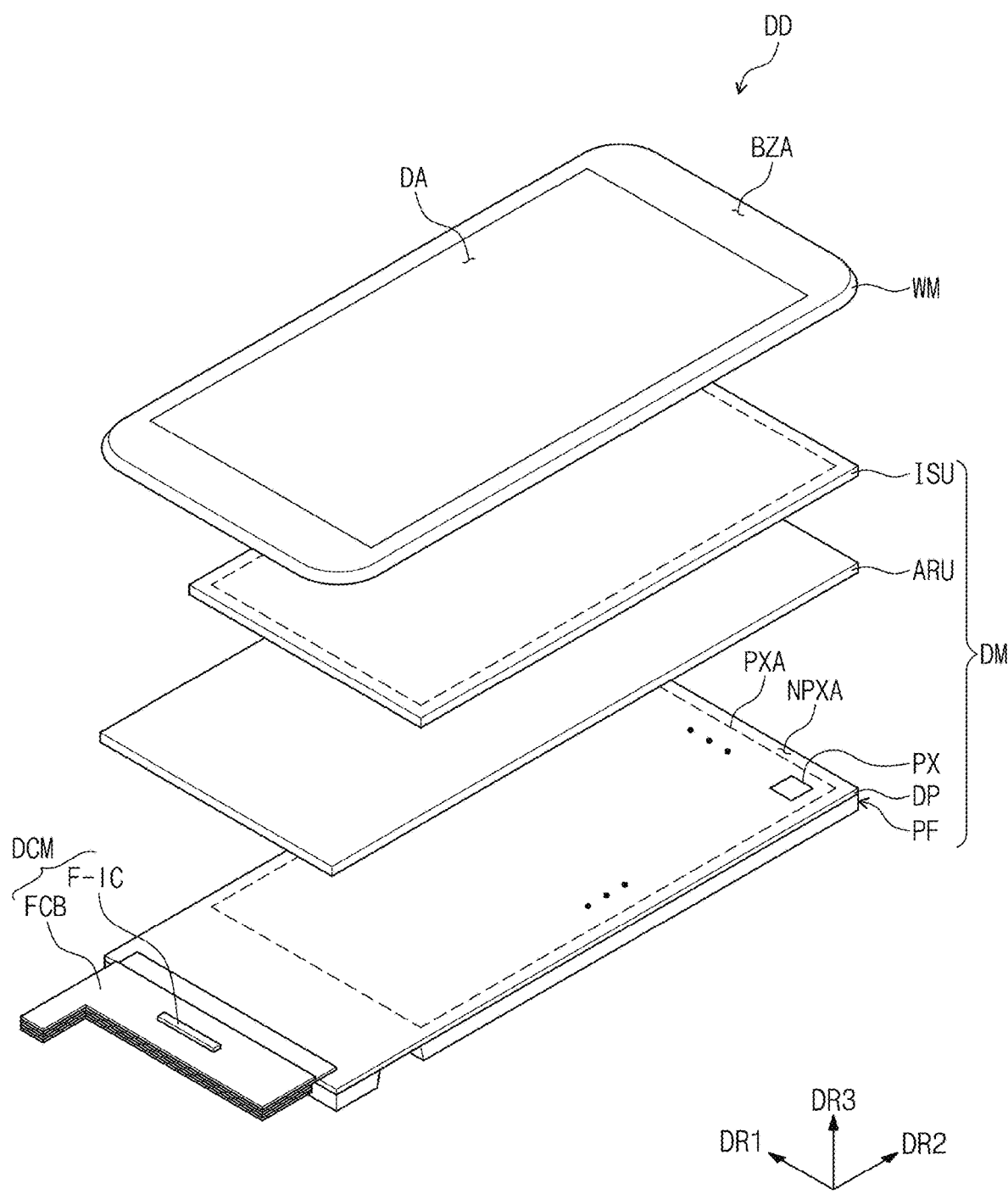
FIG. 2 is an exploded perspective view illustrating an exemplary embodiment of a display device according to the invention.
Figure 3:
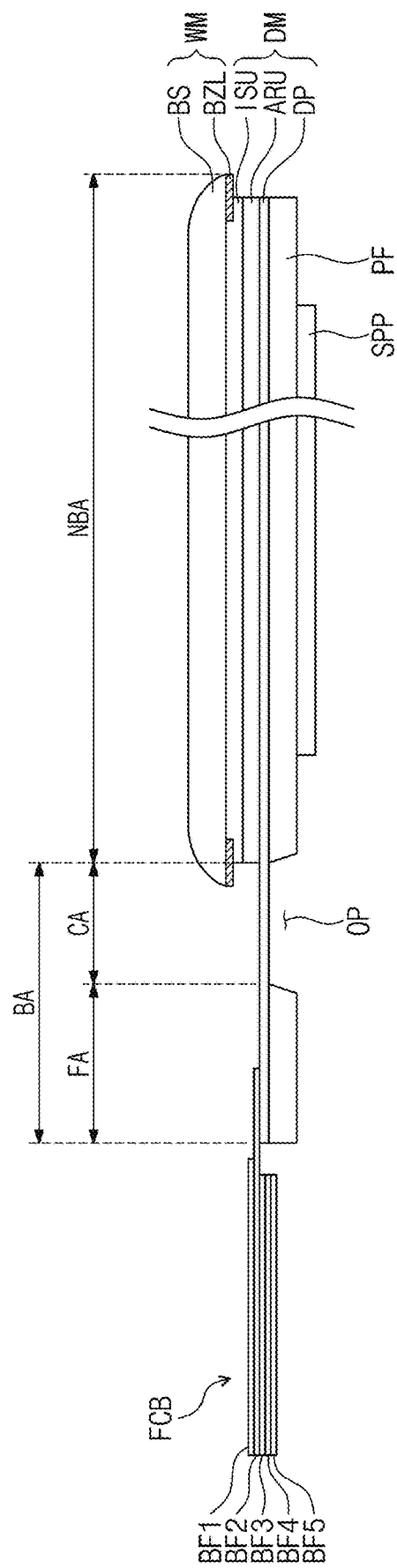
FIG. 3 is a cross-sectional view illustrating the display device of FIG. 2.

FIG. 2 is an exploded perspective view illustrating an exemplary embodiment of a display device DD according to the invention. FIG. 3 is a cross-sectional view illustrating the display device of FIG. 2. For convenience of illustration, the outer case EDC shown in FIG. 1 is omitted.

As illustrated in FIG. 2 and FIG. 3, the display device DD may include a window WM and a display module DM. The window WM may include a base layer BS and a bezel layer BZL which is disposed on a rear surface of the base layer BS. An area in which the bezel layer BZL is disposed may be defined as the bezel area BZA illustrated in FIG. 1. In the exemplary embodiment, the window WM has a flat shape in the display area DA. However, embodiments of the invention are not limited thereto. In certain embodiments, the shape of the window WM may be variously modified. As illustrated in FIG. 3, edges of the window WM may provide curved surfaces.

The base layer BS may include a glass substrate, a sapphire substrate, or a plastic substrate. The base layer BS may have a single-layered or multi-layered structure. In an exemplary embodiment, for example, the base layer BS may include a plurality of plastic films coupled to each other such as by an adhesive. In another exemplary embodiment, the base layer BS may include a glass substrate and a plastic film which is coupled to the glass substrate such as by an adhesive member.

The bezel layer BZL may have a single-layered or multi-layered structure. In an exemplary embodiment, the bezel layer BZL having the multi-layered structure may include a buffer layer for improving adhesive strength, a pattern layer for providing a predetermined pattern, and an achromatic layer. The pattern layer may provide a pattern referred to as 'a hairline'. The achromatic layer may include an organic material including a black pigment or dye. In an exemplary embodiment of fabricating the bezel layer BZL, the layers may be formed by a deposition process, a printing process, and/or a coating process.

Even though not shown in the drawings, the window WM may further include a functional coating layer disposed on a front surface of the base layer BS. The functional coating layer may include at least one of an anti-fingerprint layer, an anti-reflection layer, and a relatively hard coating layer.

The display module DM may include a display panel DP, an input sensing unit or member ISU, an anti-reflection unit or member ARU, a protective film PF, and a driving control module DCM. The display panel DP in a stretched or flat state is illustrated in FIGS. 2 and 3.

The display panel DP may be a flexible display panel, for example, an organic light emitting display panel. The display panel DP may include a pixel area PXA in which a pixel PX is disposed in plurality, and a non-pixel area NPXA adjacent to the pixel area PXA, when viewed in a plan view. The pixels PX are not disposed in the non-pixel area NPXA, but peripheral components such as electronic or conductive signal lines and pixel-defining banks may be disposed in the non-pixel area NPXA. The pixel area PXA may correspond to the display area DA (see FIG. 1), and the non-pixel area NPXA may correspond to the bezel area BZA (see FIG. 1). Shapes and/or areas of the areas corresponding to each other may be substantially the same as each other or may not be the same as each other. An image may be generated by control of the pixels PX. The peripheral components may be connected to the pixels PX and may be used to control the pixels PX to generate and/or display an image.

The input sensing unit ISU may obtain coordinate information of an external input to the display module DM. The input sensing unit ISU may sense various kinds of inputs provided from outside of the electronic device ED (see FIG. 1). In an exemplary embodiment, for example, the input sensing unit ISU may sense or recognize an input provided by a body part (e.g., a finger) or a tool of a user and/or may sense or recognize at least one of other various external inputs such as light, heat, and pressure. In addition, the input sensing unit ISU may sense a proximity input which is disposed relatively close but not contacting a sensing surface as well as a direct input coming in contact with the sensing surface.

The anti-reflection unit ARU may include a polarizing film and/or a phase retardation film. The number of the phase retardation film(s) and a phase retardation length (e.g., λ/4 or λ/2) of the phase retardation film may be determined depending on an operating principle of the anti-reflection unit ARU. The anti-reflection unit ARU may include color filters.

In the exemplary embodiment, the input sensing unit ISU and the anti-reflection unit ARU are provided as separate elements from the display panel DP. However, in another exemplary embodiment, at least one of the input sensing unit ISU and the anti-reflection unit ARU may be integrally formed with the display panel DP such as by continuous processes. At least one of the input sensing unit ISU and the anti-reflection unit ARU may be omitted.

In an exemplary embodiment, the input sensing unit ISU may be disposed on a rear surface of the window WM. The anti-reflection unit ARU may be disposed on a rear surface of the input sensing unit ISU. The display panel DP may be disposed on a rear surface of the anti-reflection unit ARU. In another exemplary embodiment, the positions of the anti-reflection unit ARU and the input sensing unit ISU may be changed relative to each other.

The protective film PF may be attached to a rear surface of the display panel DP to support and protect the display panel DP, such as by an adhesive member. The protective film PF may include a plastic film as a base layer. The protective film PF may include a plastic film including a thermoplastic resin, for example, at least one selected from a group including polyethylene terephthalate ("PET"), polyethylene ("PE"), polyvinylchloride ("PVC"), polypropylene ("PP"), polystyrene ("PS"), polyacrylonitrile ("PAN"), styrene-acrylonitrile copolymer ("SAN"), acrylonitrile-butadiene-styrene ("ABS"), polymethyl methacrylate ("PMMA"), and any combination thereof. In particular, the polyethylene terepthalate ("PET") may have excellent heat resistance, excellent stress strength, and excellent electrical characteristics and may be less affected by temperature and humidity.

However, the material of the protective film PF is not limited to the plastic resins. In another exemplary embodiment, the protective film PF may include an organic/inorganic composite material. In an exemplary embodiment, for example, the protective film PF may include a porous organic layer and an inorganic material which fills pores of the porous organic layer. In an exemplary embodiment, the protective film PF may include or be formed of a hydrophilic material.

The driving control module DCM may include a circuit board FCB connected to the display panel DP and a driving chip F-IC which is mounted on the circuit board FCB. Even though not shown in the drawings, a plurality of passive elements and/or active elements may be mounted on the circuit board FCB in addition to the driving chip F-IC. The circuit board FCB may be a flexible circuit board.

In an exemplary embodiment, the circuit board FCB may have a multi-layered structure. In an exemplary embodiment, for example, the circuit board FCB may include a plurality of base films BF1 to BF5 sequentially stacked. The driving chip F-IC and the elements may be mounted on an uppermost base film BF1 of the plurality of base films BF1 to BF5, and conductive interconnection lines may be disposed between two base films adjacent to each other and/or may extend into a thickness of one or more base film. The interconnection lines may be electrically connected to the driving chip F-IC and/or the elements. In addition, one base film BF2 (hereinafter, referred to as 'a connection base film BF2') of the plurality of base films BF1 to BF5 may have or define a pad part of the circuit board FCB for being connected to the display panel DP. The connection base film BF2 may be attached to an end of the display panel DP, such as be an adhesive member, so as to be electrically connected to the display panel DP.

In the exemplary embodiment, the driving control module DCM including one circuit board FCB is illustrated as an example. Alternatively, the driving control module DCM may include two circuit boards (e.g., first and second circuit boards, not shown). In this case, the plurality of passive elements and/or active elements may be mounted on the first circuit board, and the driving chip F-IC may be mounted on the second circuit board. The second circuit board may be provided between the display panel DP and the first circuit board to electrically connect the display panel DP and the first circuit board.

In addition, the exemplary embodiment illustrates a chip-on-film ("COF") structure in which the driving chip F-IC is mounted on the circuit board FCB. However, embodiments of the invention are not limited thereto. In another exemplary embodiment, the display device DD may have a chip-on-glass ("COG") structure in which the driving chip F-IC is mounted on the display panel DP.

In FIG. 3, the display panel DP is briefly illustrated as a single layer for the purpose of ease and convenience in description and illustration. However, the display panel DP may actually include a plurality of layers.

Figure 4:
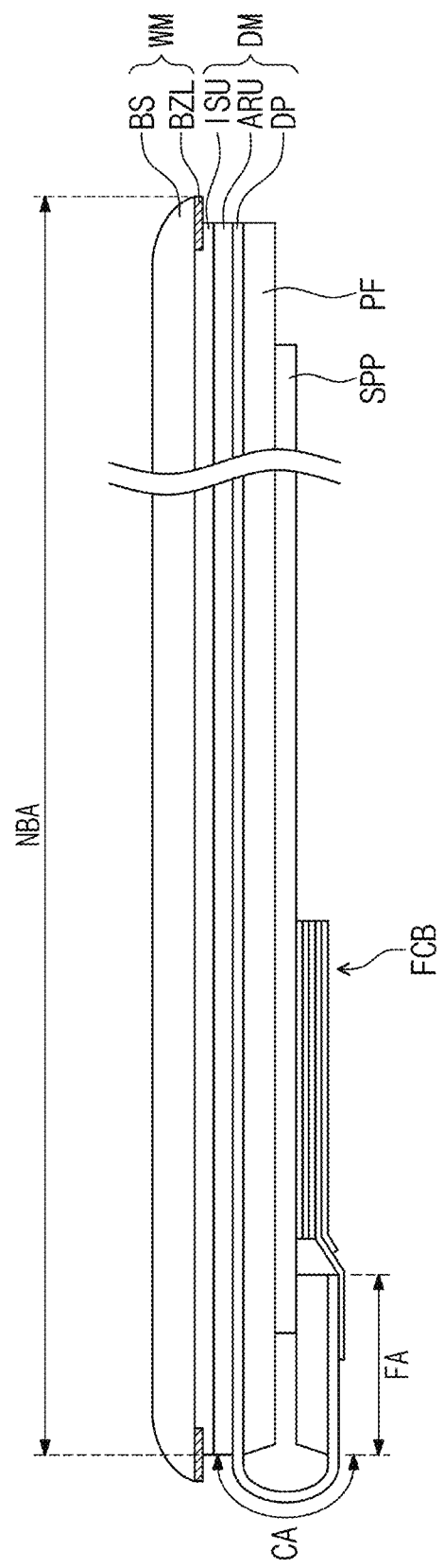
FIG. 4 is a side view illustrating the display device of FIG. 3 which is bent.
Figure 5:
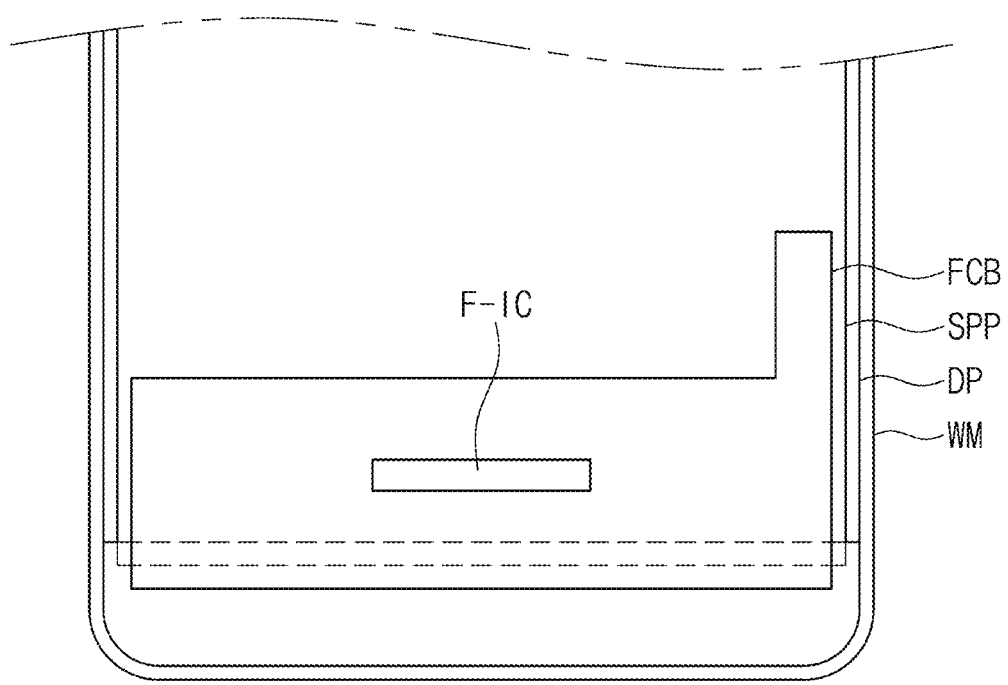
FIG. 5 is an enlarged rear view of the display device of FIG. 4.

FIG. 4 is a side view illustrating the display device of FIG. 3 which is bent, and FIG. 5 is an enlarged rear view of the display device of FIG. 4.

Referring to FIGS. 3 to 5, the display module DM may include or define two areas. In other words, the display module DM may include a non-bending area NBA and a bending area BA. The display module DM and components or layers thereof in the bending area BA may be bendable about a bending axis, while those components or layers in the non-bending area NBA may be non-bendable about the bending axis or may be bendable but not bent in the display module DM which is bent. Referring to FIGS. 1 and 2, the bending axis may extended along a width of the display module DM, that is, along the first directional axis DR1. The bending area BA may include a curvature area CA and a facing area FA. The curvature area CA may have a predetermined curvature in the display module DM which is bent, and the facing area FA may face the non-bending area NBA in the display module DM which is bent.

The non-bending area NBA and the bending area BA may be arranged along a length of the display module DM, such as along the second directional axis DR2 (see FIGS. 1 and 2). The curvature area CA may be adjacent to the non-bending area NBA along a length of the display module DM and may be defined by components or layers of the display module DM which are substantially bent in the display module which is in a bent state. The facing area FA may be adjacent to the curvature area CA along the length of the display module DM and may be defined by components or layers of the display module DM which are not curved in the display module DM in the bent state. In the bent state, the facing area FA may face the non-bending area NBA and may be spaced apart from the non-bending area NBA, such as along a thickness direction of the display module DM which is bent, such as along the third directional axis DR3. The circuit board FCB may be connected to the facing area FA.

The protective film PF may be disposed to correspond to the non-bending area NBA and the facing area FA and may not be disposed in the curvature area CA. That is, the protective film PF disposed in the non-bending area NBA and the facing area FA may terminate at the curvature area CA. An opening OP corresponding to the curvature area CA may be defined in the protective film PF. The opening OP may be extended through an entirety of the thickness of the protective film PF, without being limited thereto. Since a portion of the protective film PF is absent such as being removed at the curvature area CA to form the opening OP, stress which occurs in the curvature area CA when the display module DM is bent may be reduced. In an exemplary embodiment of the invention, the protective film PF may have a groove which is defined to correspond to the curvature area CA, where the groove is extended through a partial thickness of the protective film PF. In other words, the protective film PF in the curvature area CA may be thinner than the protective film PF in remaining areas NBA and FA.

In an exemplary embodiment of the invention, the display module DM may further include a support panel SPP. The support panel SPP may be disposed on a rear surface of the protective film PF to support the display panel DP. The support panel SPP may support thereon components or layers of the display module DM, to maintain such components or layers in a substantially flat or non-bent state, even when the display module DM is bent. The support panel SPP may be a metal plate which has a rigidity of a reference value or more. The support panel SPP may be a stainless steel plate. The support panel SPP may have a black color to block external light incident to the display panel DP.

When the curvature area CA of the display module DM is bent, the facing area FA may face the non-bending area NBA, and the circuit board FCB connected to the facing area FA may be disposed in a plane which is parallel to the non-bending area NBA of the display panel DP. A portion of the support panel SPP may be disposed between the facing area FA and the non-bending area NBA. In addition, relative to the display module DM which is bent, the circuit board FCB may be placed on a rear surface of the support panel SPP.

Figure 6:
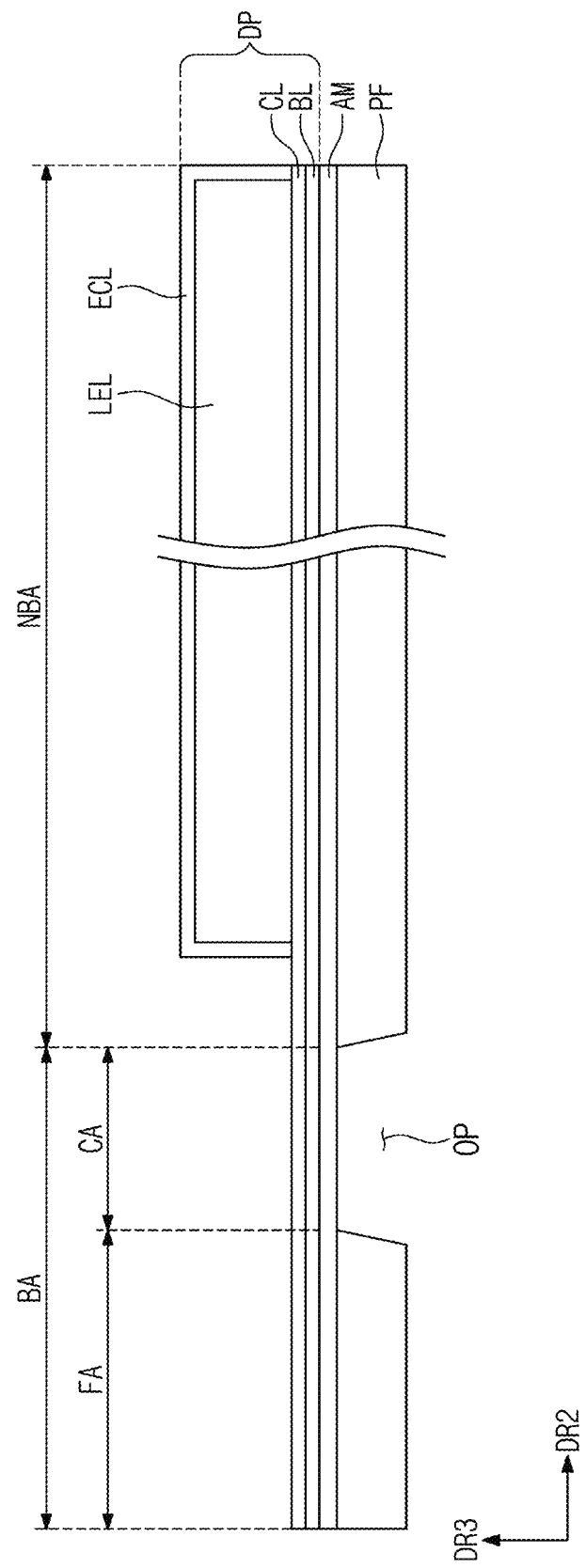
FIG. 6 is an enlarged cross-sectional view illustrating an exemplary embodiment of a portion of a display module in the display device of FIG. 3.

FIG. 6 is an enlarged cross-sectional view illustrating an exemplary embodiment of a portion of a display module in the display device of FIG. 3.

Referring to FIG. 6, the display panel DP may include a base layer BL, a circuit layer CL, an element layer LEL, and an encapsulation layer ECL.

The base layer BL may be a resin layer and may include, but not limited to, polyimide (PI). The circuit layer CL may be disposed on a front surface of the base layer BL. The circuit layer CL may have a multi-layered structure including an insulating layer, a conductive layer, and a semiconductor layer. The circuit layer CL may include a pixel circuit including a thin film transistor and signal lines connected to the pixel circuit. Portions of the circuit layer CL may be disposed in the pixels PX (see FIG. 2). The pixel circuit and elements thereof may be used to control the pixels PX to generate and/or display an image.

The element layer LEL may be disposed on a front surface of the circuit layer CL. The element layer LEL may include a light emitting element, e.g., an organic light emitting element. The element layer LEL and components thereof may be controlled to generate light and/or control light transmittance for displaying an image. The element layer LEL and components thereof may be controlled by the pixel circuit to generate and/or display the image.

The encapsulation layer ECL may be disposed on the element layer LEL to encapsulate the element layer LEL, such as sealing the element layer LEL from outside the display panel DP. The encapsulation layer ECL may have a multi-layered structure including an organic thin film and an inorganic thin film, called 'a thin film encapsulation ("TFE")'. In another exemplary embodiment, the encapsulation layer ECL may include only an inorganic thin film or may include only an organic thin film. In certain exemplary embodiments, the display panel DP may include an encapsulation substrate and a sealant, which are together substituted for the encapsulation layer ECL. The sealant may couple the encapsulation substrate onto the element layer LEL.

The base layer BL and the circuit layer CL may be disposed to correspond to the non-bending area NBA and the bending area BA. The element layer LEL and the encapsulation layer ECL may be disposed in the non-bending area NBA.

The display panel DP and the protective film PF may be coupled to each other by an adhesive member AM. In particular, a rear surface of the base layer BL and the protective film PF may be coupled to each other by the adhesive member AM. In an exemplary embodiment, for example, the adhesive member AM may be an optically clear adhesive ("OCA") film, an optically clear resin ("OCR"), or a pressure sensitive adhesive ("PSA") film.

Figure 7:
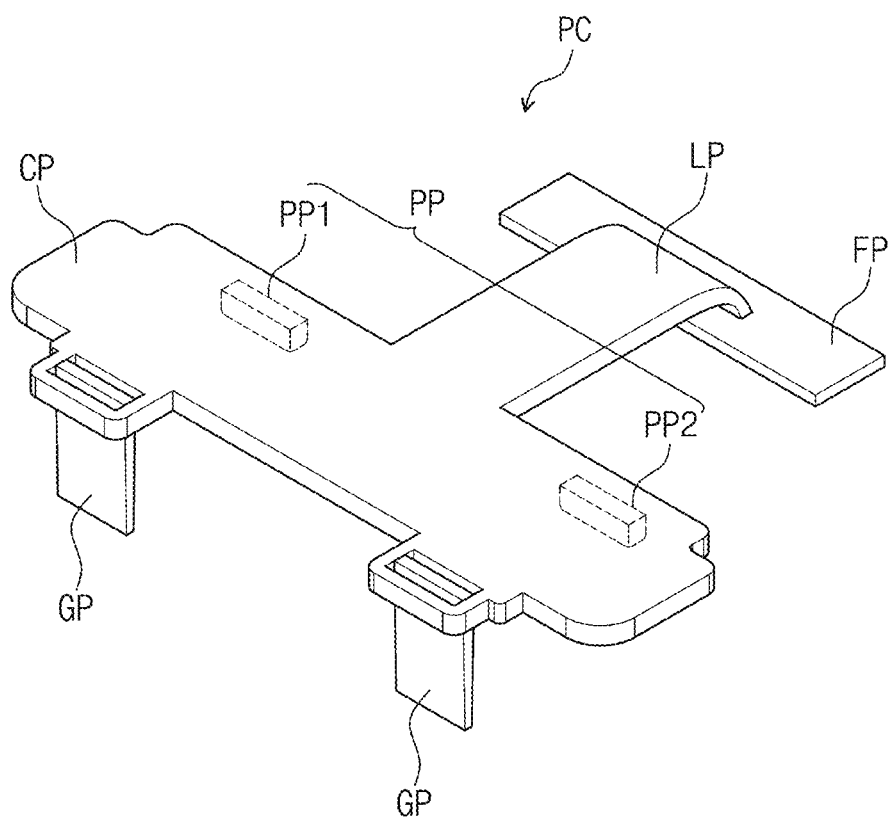
FIG. 7 is a perspective view illustrating an exemplary embodiment of a protective cover of a display device according to the invention.
Figure 8:
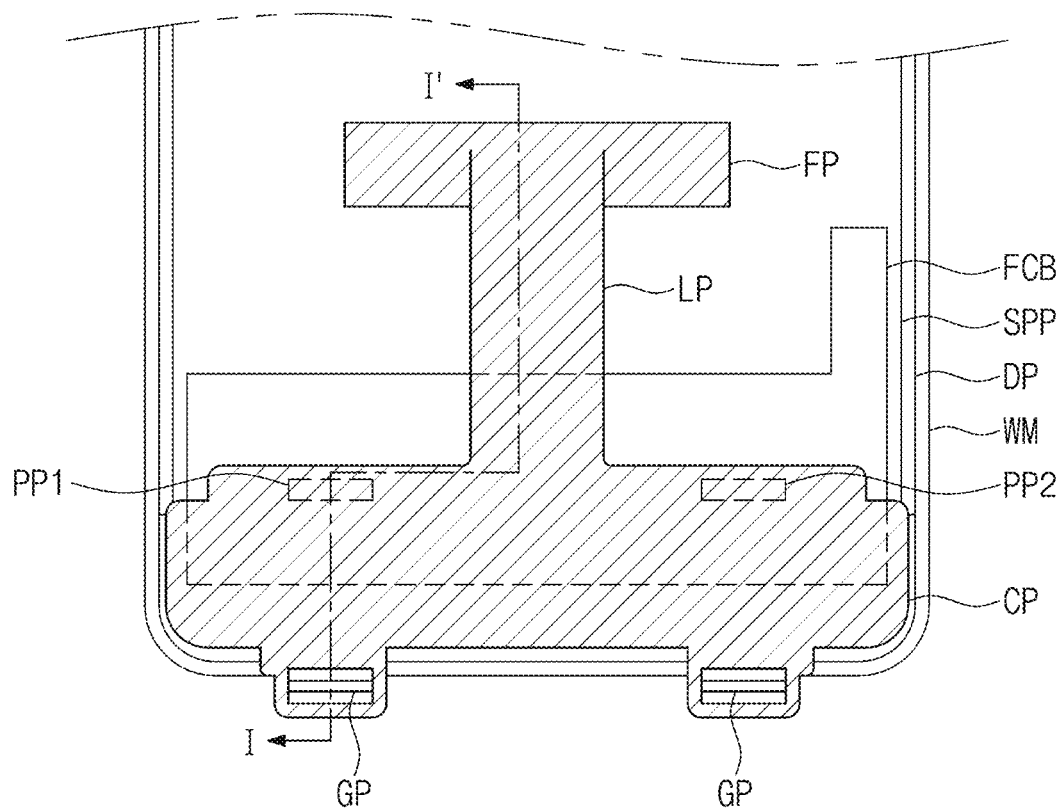
FIG. 8 is an enlarged rear view of another exemplary embodiment of a display device as including the protective cover of FIG. 7.
Figure 9:
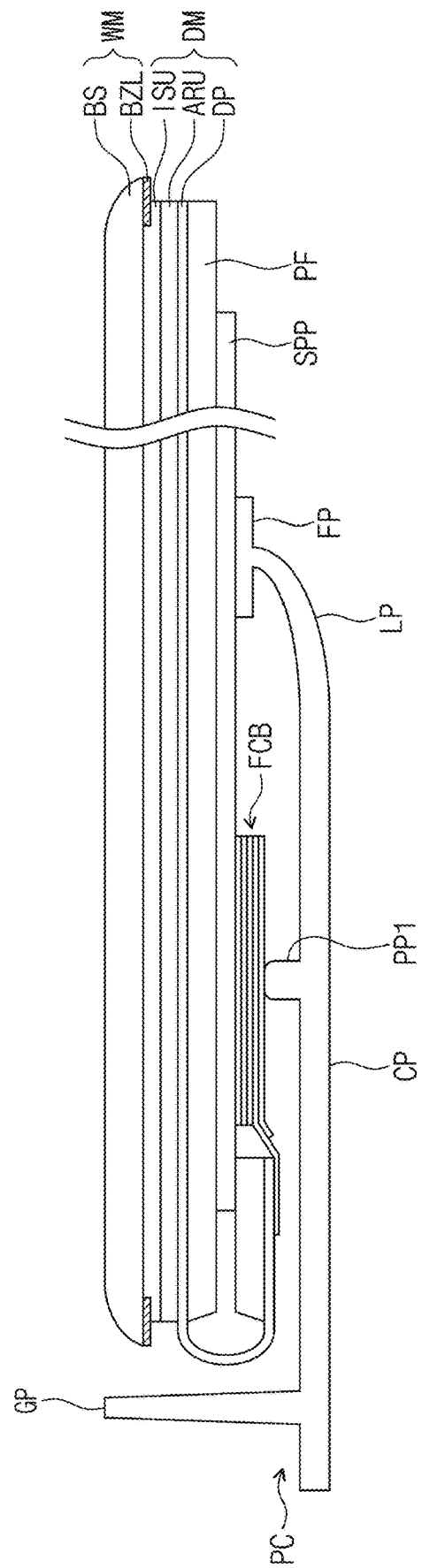
FIG. 9 is a cross-sectional view taken along line I-I' of FIG. 8.

FIG. 7 is a perspective view illustrating an exemplary embodiment of a protective cover of a display device according to the invention, FIG. 8 is an enlarged rear view another exemplary embodiment of a display device as including the protective cover of FIG. 7, and FIG. 9 is a cross-sectional view taken along line I-I' of FIG. 8.

Referring to FIGS. 7 to 9, a display device DD according to the exemplary embodiment may further include a protective cover PC which is disposed on the rear surface of the display module DM to cover the bending area BA (see FIG. 3) of the display panel DP. The protective cover PC may cover a portion of the driving control module DCM (see FIG. 2) disposed on the rear surface of the display module DM.

Since the protective cover PC covers the bending area BA, defects which may occur when the display device DD is transferred during manufacturing thereof, may be reduced. Such defects may be reduced because the protective cover PC blocks external impact and foreign material to components or layers of the display device DD which area exposed at the bending area BA.

The protective cover PC may include a plastic material such as polycarbonate. In an exemplary embodiment of fabricating a display device, the protective cover PC may be formed by a plastic material molding method such as an extrusion molding method or an injection molding method. However, the material of the protective cover PC is not limited thereto. In other exemplary embodiments, the protective cover PC may include a metal material or an organic/inorganic material.

The protective cover PC may include a (main) cover portion CP, a support portion PP, and a fixing portion FP. The cover portion CP may correspond to the bending area BA and the driving control module DCM to cover the bending area BA of the display panel DP and a portion of the driving control module DCM. In particular, the cover portion CP may cover the facing area FA (see FIG. 4) and a portion of the circuit board FCB.

In FIG. 7, the cover portion CP has a plate shape and may be flat. However, exemplary embodiments of the invention are not limited thereto. In another exemplary embodiment, the cover portion CP may have a container shape having a plate portion and a sidewall portion which extends from the plate portion to define a (receiving) recess. In this case, the recess may have a size capable of receiving the facing area FA of the display panel DP and the portion of the circuit board FCB.

In the display device DD which is bent, the support portion PP may be in contact, such as direct contact, with a portion of the driving control module DCM to support the driving control module DCM. In an exemplary embodiment of the invention, the support portion PP may include one or more support protrusion (e.g., first and second support protrusions PP1 and PP2) protruding from the cover portion CP. The first and second support protrusions PP1 and PP2 may protrude from an inner surface of the cover portion CP to support a portion of the circuit board FCB. In an exemplary embodiment, a top surface of each of the first and second support protrusions PP1 and PP2 may be in contact, such as direct contact, with the uppermost base film BF1 (see FIG. 3) of the circuit board FCB to support the circuit board FCB. Here, the inner surface of the cover portion CP may be defined as a surface facing the portion of the circuit board FCB.

The fixing portion FP may be used to fix the protective cover PC to the rear surface of the display module DM. Here, the rear surface of the display module DM may be the rear surface of the support panel SPP. When the support panel SPP is omitted, the rear surface of the display module DM may be the rear surface of the protective film PF. The fixing portion FP may have a plate shape and a top surface of the fixing portion FP may face the rear surface of the display module DM.

The protective cover PC may further include a connection portion LP which extends from one side of the cover portion CP to connect the fixing portion FP and the cover portion CP to each other. When the top surface of the fixing portion FP is defined as a surface facing the rear surface of the support panel SPP, the connection portion LP may be integrally connected to a rear surface of the fixing portion FP.

The protective cover PC may further include a guide bar GP which faces an edge of the window WM and protects the curvature area CA (see FIG. 4) of the display module DM. The guide bar GP may protrude in a direction perpendicular to the inner surface of the cover portion CP, and an inner sidewall of the guide bar GP may face the edge side surface of the window WM and the curvature area CA. Thus, the guide bar GP may protect the curvature area CA and the edge portion of the window WM from an external impact.

In particular, as a bezel width of the window WM is reduced, securing a space in which the protective cover PC supports the edge portion of the window WM may be difficult. However, the protective cover PC according to one or more exemplary embodiment of the invention may include the support portion PP for supporting the circuit board FCB, and thus the bending area BA may be stably protected in the display device DD having a relatively narrow bezel (see bezel area BZA in FIGS. 1 and 2).

Figure 10:
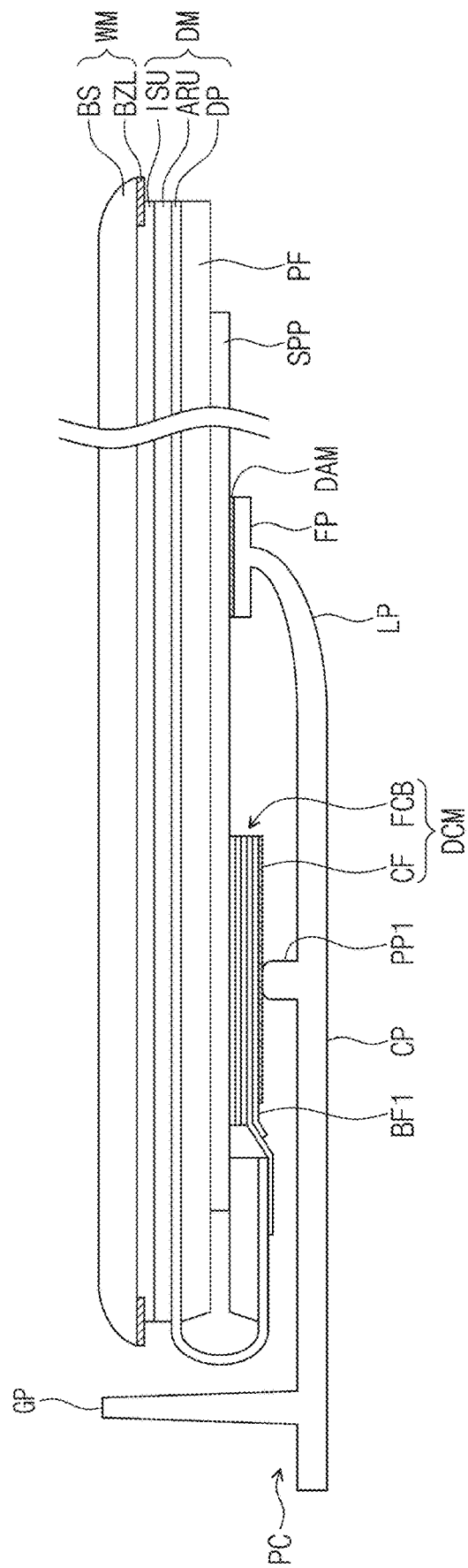
FIG. 10 is a cross-sectional view illustrating still another exemplary embodiment of a display device according to the invention.

FIG. 10 is a cross-sectional view illustrating still another exemplary embodiment of a display device according to the invention. Hereinafter, the detailed descriptions to the same components as mentioned with reference to FIGS. 1 to 9 will be omitted for the purpose of ease and convenience in description.

Referring to FIG. 10, in a display device DD according to an exemplary embodiment of the invention, the driving control module DCM may further include a cover film CF for covering the circuit board FCB. The cover film CF may cover a top surface of the circuit board FCB. In the exemplary embodiment, the top surface of the circuit board FCB may be defined as a top surface of the uppermost base film (e.g., a first base film BF1), on which a plurality of elements and the driving chip F-IC (see FIG. 2) are mounted. The top surface of the circuit board FCB may face the inner surface of the cover portion CP of the protective cover PC in the bent state of the display module DM.

The cover film CF may be an adhesive film. In an exemplary embodiment of fabricating a display device, the adhesive film may be adhered to protect the elements and the driving chip F-IC mounted on the top surface of the circuit board FCB in a process of fabricating the electronic device ED. When the fabrication of the electronic device ED is completed, the cover film CF may be removed from the circuit board FCB, but is not limited thereto.

The first and second support protrusions PP1 and PP2 may protrude from the inner surface of the cover portion CP to support a portion of the circuit board FCB. In an exemplary embodiment, the top surface of each of the first and second support protrusions PP1 and PP2 may support the circuit board FCB. Here, the inner surface of the cover portion CP may be defined as a surface facing the portion of the circuit board FCB.

In the exemplary embodiment, the support portion PP of the protective cover PC may be in contact, such as direct contact, with the cover film CF. As illustrated in FIG. 10, the top surface of the first support protrusion PP1 of the support portion PP may be in contact with the cover film CF to support the display module DM.

The protective cover PC may further include a buffer member (not shown) disposed between the support portion PP and the cover film CF. The buffer member may be a buffer tape adhered to the top surface of the support portion PP. Thus, when the support portion PP supports the circuit board FCB, an external impact transferred to the circuit board FCB may be reduced.

The protective cover PC may further include a double-sided adhesive member DAM for fixing the fixing portion FP to the rear surface of the display module DM. One surface of the double-sided adhesive member DAM may be adhered to the top surface of the fixing portion FP and the other surface of the double-sided adhesive member DAM may be adhered to the rear surface of the support panel SPP, and thus a position of the protective cover PC may be fixed. The double-sided adhesive member DAM may be a double-sided adhesive tape. When the protective cover PC is removed, the double-sided adhesive member DAM may be easily detached from the rear surface of the support panel SPP. As a result, a process of detaching the protective cover PC may be easily performed.

FIG. 10 illustrates the structure which uses the double-sided adhesive member DAM to fix the protective cover PC to the display module DM. However, exemplary embodiments of the invention are not limited thereto. In another exemplary embodiment, the shape of the fixing portion FP and/or the cover portion CP may be modified or processed to fix the protective cover PC to the display module DM.

Figure 11:
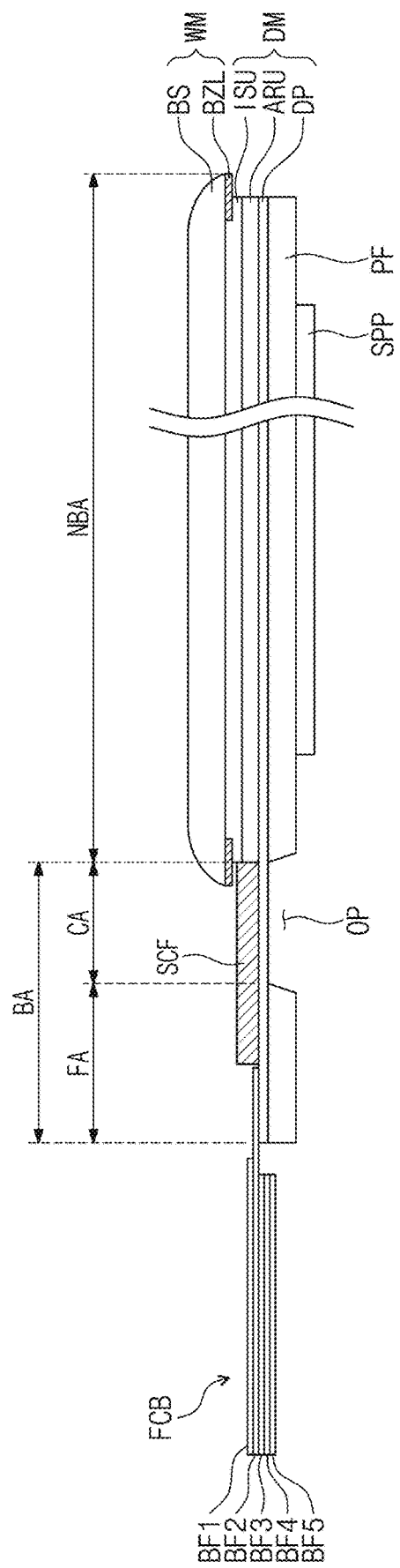
FIG. 11 is a cross-sectional view illustrating yet another exemplary embodiment of a display device according to the invention.
Figure 12:
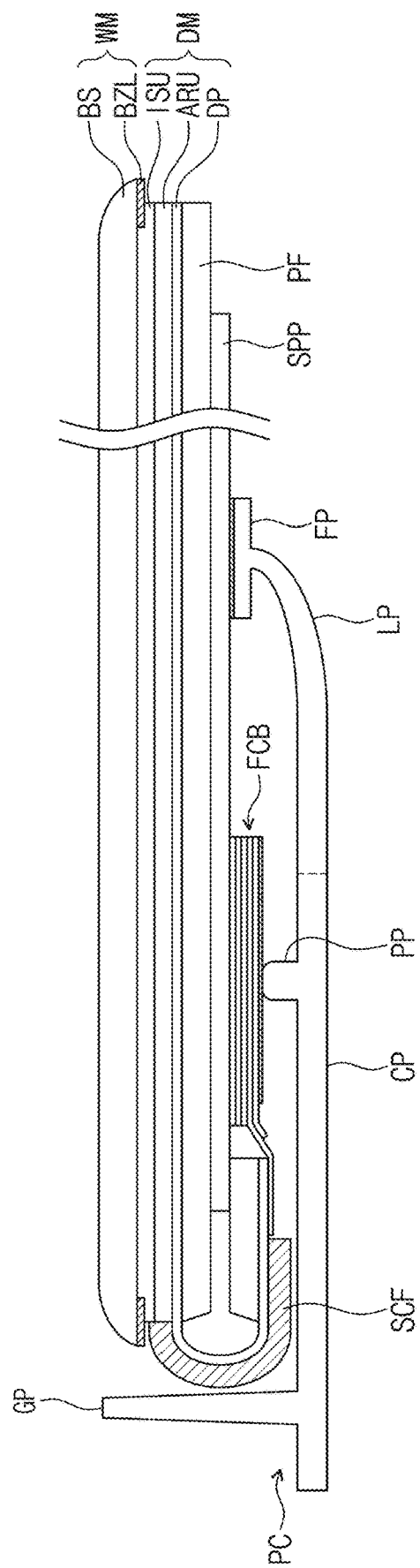
FIG. 12 is a cross-sectional view illustrating the display device of FIG. 11 which is bent.

FIG. 11 is a cross-sectional view illustrating yet another exemplary embodiment of a display device according to the invention, and FIG. 12 is a cross-sectional view illustrating the display device of FIG. 11 which is bent. Hereinafter, the detailed descriptions to the same components as mentioned with reference to FIGS. 1 to 10 will be omitted for the purpose of ease and convenience in description.

Referring to FIGS. 11 and 12, the display module DM may further include a stress control film SCF which is disposed on a front surface of the display panel DP to correspond to at least the curvature area CA. The stress control film SCF may terminate at the non-bending area NBA so as to not be disposed in the non-bending area NBA.

The stress control film SCF may overlap with the curvature area CA and the facing area FA. The stress control film SCF may include a plastic material in a film shape, like the protective film PF. A neutral plane of the curvature area CA, which is defined in the bending of the display module DM, may be generated adjacent to the circuit layer CL (see FIG. 6) by the stress control film SCF. Thus, the stress control film SCF may reduce stress applied to the circuit layer CL by the bending of the display module DM. A neutral plane or neutral surface is a conceptual plane within a member, that when loaded by a bending force, the member is bent so that the inner surface thereof is in compression and the outer surface thereof is in tension. As a result, damage to signal lines formed in the circuit layer CL in the bending area BA, by the stress caused by the bending of the display module DM, may be reduced or effectively prevented.

Figure 13:
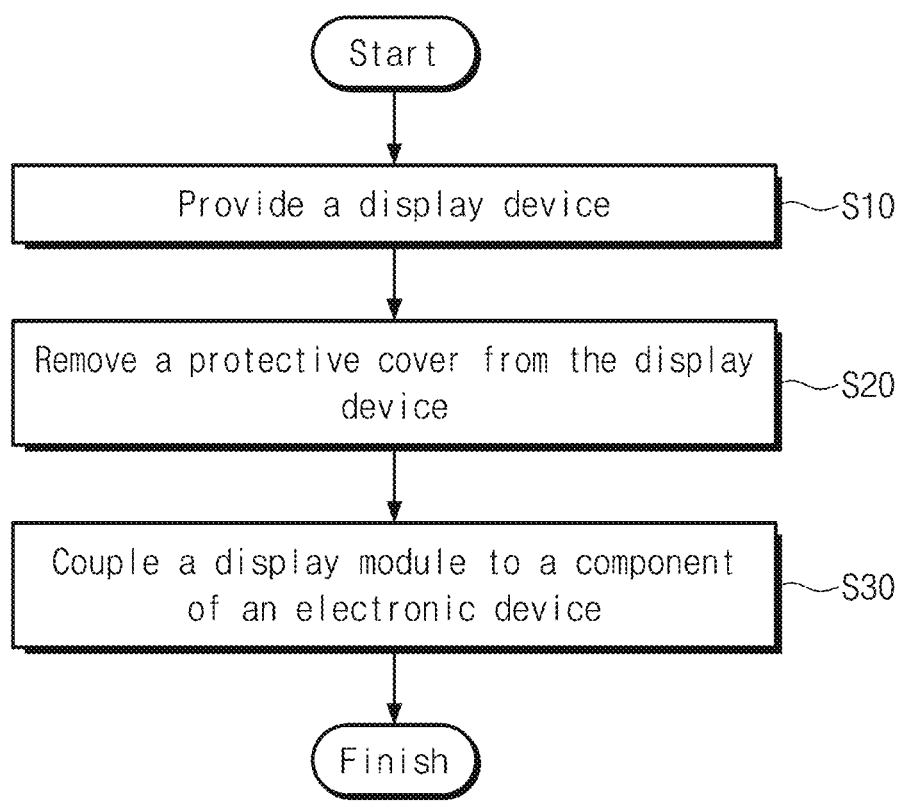
FIG. 13 is a flowchart illustrating an exemplary embodiment of a method for fabricating an electronic device according to the invention.

FIG. 13 is a flowchart illustrating an exemplary embodiment of a method for fabricating an electronic device according to the invention. Hereinafter, the reference designators of the components will refer to FIGS. 1 to 12.

A display device DD may be provided (S10). The display device DD may be any one or more of the display device DD described with reference to FIGS. 1 to 12. The display device DD may include the display module DM and the protective cover PC. In an exemplary embodiment, the display module DM may be bent at the curvature area CA to dispose the driving control module DCM facing a rear surface of the display module DM. Thus, the providing S10 of the display device DD may include installing the protective cover PC to the display module DM which is bent in such a way that the support portion PP is in contact with the uppermost base film BF1 of the plurality of base films BF1 to BF5.

While the display device DD having the protective cover PC attached thereto is transferred during the method for fabricating an electronic device, the display module DM protected by the protective cover PC may be transferred without a defect.

The protective cover PC which is attached to the bent display module DM, may be removed from the bent display module DM (S20). That is, the providing a display device (S10) may include the protective over PC removably attached to the display module DM after the display module DM is bent at the bending area BA. The removing of the protective cover PC may expose components or layers of the bent display device DD to outside thereof.

Thereafter, the display module DM from which the protective cover PC has been removed may be coupled to a component of an electronic device ED (S30) which is separate from other components and/or layers of the display device DD including the display module DM from which the protective cover PC has been removed. The component of the electronic device ED may include the outer case EDC (see FIG. 1) which is physically coupled to the display module DM having the protective cover PC removed therefrom.

When the component of the electronic device ED is physically coupled to the display module DM, an adhesive member and additional structures may be used.

According to one or more embodiment of the invention, the protective cover may cover the bending area of the display module such as during transfer thereof, and thus reducing defects which may occur when the display device is transferred is possible. The reduction in defects which may occur during transfer of the display device is possible because the protective cover blocks external impact and foreign material to components or layers of the display device DD which may be otherwise exposed outside thereof without the protective cover.

As a bezel width of a window within a display device is reduced, supporting the window by a protective cover may be difficult, especially during transfer of the display device during a fabrication method thereof. However, the protective cover which is removably attached according to one or more embodiment of the invention may include the support portion for supporting the exposed circuit board of the driving control module, and thus the bending area of the display device having a narrow bezel may be stably protected.

While the invention has been described with reference to exemplary embodiments, it will be apparent to those skilled in the art that various changes and modifications may be made without departing from the spirit and scope of the invention. Therefore, it should be understood that the above exemplary embodiments are not limiting, but illustrative. Thus, the scope of the invention is to be determined by the broadest permissible interpretation of the following claims and their equivalents, and shall not be restricted or limited by the foregoing description.

What is claimed is:

1. A display device comprising:
a display module which displays an image, the display module including a bending area at which the display module is bent, and a non-bending area which extends from the bending area;
a driving control module connected to the bending area of the display module; and
a protective cover removably attachable to the display module, the protective cover comprising a cover portion and a support portion which protrudes from the cover portion,
wherein
the display module bent at the bending area thereof disposes the driving control module facing a rear surface of the display module,
the cover portion of the protective cover corresponds to the bending area of the display module and to the driving control module facing the rear surface of the display module, and
the support portion corresponds to the driving control module.

2. The display device of claim 1, wherein the support portion comprises at least one support protrusion protruding from the cover portion.

3. The display device of claim 2, wherein the support protrusion protrudes from an inner surface of the cover portion to support a portion of the driving control module, and wherein the inner surface is a surface facing the portion of the driving control module.

4. The display device of claim 3, wherein the driving control module facing the rear surface of the display module comprises a circuit board attached to the bending area of the display module, the circuit board comprising a plurality of base films sequentially stacked.

5. The display device of claim 4, wherein the display module bent at the bending area thereof disposes the support protrusion of the protective cover in contact with the circuit board of the driving control module disposed facing the rear surface of the display module.

6. The display device of claim 4, wherein the driving control module facing the rear surface of the display module further comprises:
   a circuit element mounted on an outer surface of the plurality of base films; and
   a cover film covering the circuit element.

7. The display device of claim 6, wherein the display module bent at the bending area thereof disposes the support protrusion of the protective cover in contact with the cover film of the driving control module disposed facing the rear surface of the display module.

8. The display device of claim 1, wherein the protective cover further comprises a fixing portion with which the protective cover is fixable to the rear surface of the display module.

9. The display device of claim 8, wherein the fixing portion of the protective cover has a plate shape, and the protective cover attached to the display module bent at the bending area thereof disposes the fixing portion of the protective cover facing the rear surface of the display module.

10. The display device of claim 9, wherein the protective cover further comprises a double-sided adhesive member with which the fixing portion of the protective cover is fixable the rear surface of the display module.

11. The display device of claim 9, wherein the protective cover further comprises a connection portion which extends from an end of the cover portion and connects the fixing portion and the cover portion to each other.

12. The display device of claim 1, further comprising a window through which the image from the display module is viewable,
   wherein
   the protective cover further comprises a guide bar protruding from the cover portion,
   the display module bent at the bending area thereof disposes the bending area at an end of the display module, and
   the guide bar of the protective cover faces both an edge of the window and the bending area of the display module at the end of the display module.

13. The display device of claim 1, further comprising a window through which the image from the display module is viewable,
   wherein the display module comprises:
      a display panel corresponding to the non-bending area and the bending area; and
      an input sensing member with which an input to the display module is sensed, the
      input sensing member disposed between the window and the display panel.

14. The display device of claim 13, wherein the display module further comprises a protective film which disposes the display panel between the input sensing member and the protective film.

15. The display device of claim 14, wherein the bending area of the display module comprises:
   a curvature area at which the bending area is curvable; and
   a facing area which disposes the curvature area between the non-bending area and the facing area,
   the protective film corresponds to the non-bending area and the facing area and comprises an opening along an area corresponding to the curvature area, and
   the display module bent at the bending area thereof disposes the facing area facing the non-bending area.

16. The display device of claim 15, wherein
   the display module further comprises a stress control film corresponding to the curvature area, the stress control film terminating at the non-bending area, and
   the display module bent at the bending area thereof disposes each of the curvature area and the stress control film which corresponds thereto at a same end of the display module.

17. The display device of claim 14, wherein the display module further comprises a support panel corresponding to the non-bending area of the display module and disposes the protective film between the display panel and the support panel in the non-bending area.

18. The display device of claim 13, wherein the display panel comprises:
   a base layer disposed corresponding to each of the non-bending area and the bending area of the display module;
   a circuit layer disposed on the base layer and disposed corresponding to each of the non-bending area and the bending area of the display module;
   an element layer from which light is emitted, the element layer disposed on the circuit layer and corresponding to the non-bending area of the display module; and
   an encapsulation layer which encapsulates the element layer on the base layer.

19. A method for fabricating an electronic device, the method comprising:
   providing a display device comprising:
      a display module which displays an image and includes a bending area at which the display module is bent and a non-bending area which extends from the bending area,
      a driving control module connected to the bending area of the display module, and
      a protective cover removably attachable to the display module, the protective cover comprising a cover portion and a support portion which protrudes from the cover portion;
   bending the display module at the bending area thereof, the display module bent at the bending area thereof disposing the driving control module facing a rear surface of the display module; and
   supporting the driving control module facing the rear surface of the display module through the protective cover, the attaching the protective cover to the display module disposes each of:
      the cover portion of the protective cover corresponding to the bending area of the display module and to the driving control module facing the rear surface of the display module, and
      the support portion corresponding to the driving control module;
   removing the protective cover from the display module; and coupling the display module from which the protective cover is removed to a component of the electronic device.

20. The method of claim 19, wherein wherein the support portion comprises at least one support protrusion protruding from the cover portion, and the driving control module disposed facing the rear surface of the display module comprises a circuit board attached to the bending area of the display module, the circuit board comprising a plurality of base films sequentially stacked, and the attaching the protective cover to the display module disposes the support protrusion of the protective cover in contact with the driving control module disposed facing the rear surface of the display module at an outermost base film among the plurality of base films.

* * * * *